United States Patent [19]

Pazos

[11] 4,050,941
[45] Sept. 27, 1977

[54] HIGH RESOLUTION PHOTOHARDENABLE COATING COMPOSITIONS CONTAINING TETRACYANOETHANE COMPOUNDS

[75] Inventor: José Francisco Pazos, Claymont, Del.

[73] Assignee: E. I. Du Pont de Nemours and Company, Wilmington, Del.

[21] Appl. No.: 752,618

[22] Filed: Dec. 20, 1976

[51] Int. Cl.$^2$ .................... G03C 1/68; G03C 5/00; C08F 8/18
[52] U.S. Cl. .................... 96/115 P; 96/35.1; 96/115 R; 204/159.18; 204/159.23; 204/159.24
[58] Field of Search .............. 96/115 P, 115 R, 35.1; 204/159.18, 159.23, 159.24

[56] References Cited

U.S. PATENT DOCUMENTS

| | | | |
|---|---|---|---|
| 2,791,504 | 5/1957 | Plambeck | 96/35.1 |
| 2,927,022 | 3/1969 | Martin et al. | 96/35.1 |
| 3,844,790 | 10/1974 | Chang et al. | 96/115 P |
| 3,885,964 | 5/1975 | Nacci | 96/115 P |
| 3,888,672 | 6/1975 | Lee | 96/115 P |

*Primary Examiner*—Jack P. Brammer

[57] ABSTRACT

Photohardenable coating compositions containing
 a. a substantially solid, organic composition comprising a nongaseous, ethylenically unsaturated compound,
 b. a tetracyanoethane compound, and
 c. an organic, radiation-sensitive free radical generating system provide high resolution films and coatings such as photoresist coatings on substrates.

17 Claims, No Drawings

HIGH RESOLUTION PHOTOHARDENABLE COATING COMPOSITIONS CONTAINING TETRACYANOETHANE COMPOUNDS

BACKGROUND OF THE INVENTION

1. Field of the Invention

This invention relates to photohardenable coating compositions, and more particularly to improved films and coatings having high resolution. Still more particularly, it relates to the addition of certain tetracyanoethane compounds to photohardenable coating compositions to obtain high resolution.

2. Description of the Prior Art

Processes for imagewise photohardening photohardenable films and coatings wherein unsaturated compounds are polymerized or suitable polymers are crosslinked by free radicals generated photochemically are well-known in the art. In these processes radiation is normally absorbed to provide the initiating species. The amount of radiation available for the production of initiating species will, therefore, decrease progressively from the surface downwards. In the deeper layers of the composition, hardening will be correspondingly less rapid. At the same time, radiation will be scattered into nonilluminated areas by the film and by reflection from the substrate thus initiating hardening in those areas. Further, active initiating species can diffuse from illuminated to nonilluminated areas. These phenomena tend to limit resolution.

Conventional polymerization inhibitors can improve resolution somewhat. This is because inhibitors destroy the initiating radicals until sufficient intiating radicals have been generated to completely consume the inhibitor, whereupon hardening will then proceed. Since the radiation entering nonilluminated areas by scattering, etc., generally has a lesser intensity than in the illuminated areas, the effect of the inhibition is greatest in such areas. The concentration of inhibitor necessary to prevent photohardening caused by scattered radiation is so high, however, that undesirable retardation of photohardening in the exposed areas of the film occurs.

High resolution has been obtained heretofore in photopolymerizable coating compositions by the use of nitroso dimers. In U.S. application Ser. No. 697,947, filed June 21, 1976, Nacci and Pazos claim photohardenable films consisting essentially of:

a. a substantially solid organic composition comprising an addition-polymerizable, nongaseous ethylenically unsaturated compound capable of forming a high polymer by free-radical initiated chain-propagating addition polymerization, and a macromolecular organic polymeric binder, b. 0.04–3% by weight, based on the total film material, of solvent-soluble nitroso dimer which is a noninhibitor of free-radical polymerization but dissociates to nitroso monomer which is an inhibitor of free-radical polymerization, contains a dinitroso group, and is characterized by a dissociation constant of $10^{-2} - 10^{-10}$ in solution at 25° C and a rate of dissociation having a half-life of at least 0.5 minute in solution at 25° C, and c. 1.0–10% by weight, based on the total film material, of an organic, radiation-sensitive free-radical generating system activatable by actinic radiation which initiates polymerization of the unsaturated compound and does not dissociate the nitroso dimer to nitroso monomer, with the proviso that the weight ratio of nitroso dimer to free-radical generating system is no greater than 2:1, said free-radical generating system being proportioned to give said film at its particular thickness a mean optical density of 0.02–1.25 to radiation in the spectral region in which the free-radical generating system absorbs radiation.

SUMMARY OF THE INVENTION

The present invention comprises photohardenable coating compositions comprising a. a substantially solid, organic composition comprising an addition polymerizable, nongaseous, ethylenically unsaturated compound capable of forming a high polymer by free-radical initiated chain-propagating addition polymerization, and a macromolecular, organic, polymeric binder, b. about 1.0 to about 10% by weight, based on the total solvent-free coating components, of an organic, radiation-sensitive free-radical generating system activatable by actinic radiation, which initiates polymerization of the unsaturated compound, and c. about 0.04 to about 3% by weight, based on the total solvent-free coating components, of a tetracyanoethane compound of the formula $$R^1C(CN)_2C(CN)_2R^2$$

where $R^1$ and $R^2$ are both p-chlorophenyl or p-bipenyl, or $R^1$ is p-biphenyl and $R^2$ is

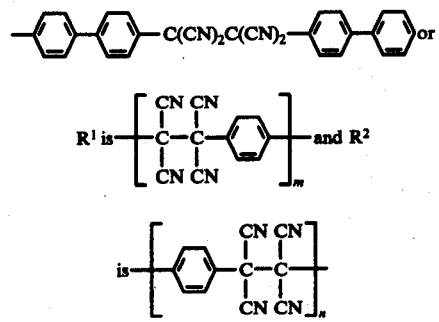

where $m$ and $n$ represent the number of units, or $R^1$ and $R^2$ are joined together to form the $-CH(OC_2H_5)CH_2-$ radical, or $R^1$ and $R^2$ are joined together to form the

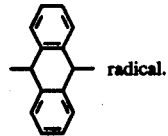

DETAILED DESCRIPTION OF THE INVENTION

The present invention is directed to photohardenable coating compositions which provide photohardenable films and coatings having a high degree of resolution. Resolution is ordinarily measured as the number of line pairs per linear millimeter (mm) which can be resolved. For one line pair per mm, "lines" 0.5 mm in width are photohardened, separated by "lines" 0.5 mm in width of unhardened material which, for a photoresist film, must extend completely through the film thickness. Ordinarily the unhardened material will be removed by washing with water, an organic solvent or the like as described hereafter thereby leaving gaps between the hardened lines. Higher resolution implies a higher aspect ratio for the lines, where apsect ratio is equal to the height of the line divided by its width, or to $2tR$, where R is the resolution in line pairs/mm and $t$ is the height of the line in mm. Ordinarily the resolution is a function of film thickness, although not necessarily a linear function.

The compositions of this invention are distinguished from the photopolymerizable compositions of the prior art in that they contain selected tetracyanoethane compounds which function to give enhancement of resolution of the photohardenable coating or film. Although the mechanism by which the present invention operates has not been established, and it is not intended that this invention be limited to any particular theory, it is believed that the tetracyanoethane compounds themselves are noninhibitors of photopolymerization, but are selectively converted to inhibitor forms during exposure to radiation.

The photohardenable coating compositions of this invention contain a solvent-soluble, substantially solid, organic composition of the unsaturated compound-/binder type containing at least one nongaseous, ethylenically unsaturated compound capable of forming a high polymer by free-radical initiated, chain-propagating addition polymerization, and a macromolecular organic polymer as the binder. The particular nature of the unsaturated compound/binder system is not critical to this invention.

Suitable free-radical initiated, chain-propagating addition polymerizable, ethylenically unsaturated compounds include preferably an alkylene or a polyalkylene polyol triacrylate prepared from an alkylene polyol of 2–15 carbon atoms or a polyalkylene ether polyol or glycol of 1–10 ether linkages, and the compounds disclosed by Martin and Barney in U.S. Pat. No. 2,927,022, e.g., those having a plurality of addition polymerizable ethylenic linkages, particularly when present as terminal linkages, and especially those wherein at least one and preferably most of such linkages are conjugated with a doubly bonded carbon, including carbon doubly bonded to carbon and to heteroatoms such as nitrogen, oxygen and sulfur. Outstanding are such materials wherein the ethylenically unsaturated groups, especially the vinylidene groups, are conjugated with ester or amide structures.

The following specific compounds are further illustrative of this class: unsaturated esters of alcohols, preferably polyols, and particularly such esters of alphamethylene carboxylic acids, e.g., ethylene glycol diacrylate, diethylene glycol diacrylate, glycerol diacrylate, glycerol triacrylate, trimethylolpropane triacrylate, ethylene glycol dimethacrylate, 1,3-propanediol dimethacrylate, 1,2,4-butanetriol trimethacrylate, 1,4-cyclohexanediol diacrylate, 1,4-benzenediol dimethacrylate, 1,2-benzenedimethanol diacrylate, pentaerythritol tetramethacrylate, 1,3-propanediol diacrylate, 1,3-pentanediol dimethacrylate, p-α, α-dimethylbenzylphenyl acrylate, the bis-acrylates and methacrylates of polyethylene glycols of molecular weight 200–500, and the like; unsaturated amides, particularly those of alphamethylene carboxylic acids, especially with alpha-omega-diamines and oxygen-interrupted omega-diamines, such as methylene bis-acrylamide, methylene bis-methacrylamide, ethylene bis-methacrylamide, 1,6-hexamethylene bis-acrylamide, diethylene triamine tris-methacrylamide, bis( -methacrylamidopropoxy)ethane, beta-methacrylamidoethyl methacrylate, N-(beta-hydroxyethyl)-beta-(methacrylamido)- ethyl acrylate, and N,N-bis(beta-methacryloxyethyl) acrylamide; vinyl esters such as divinyl succinate, divinyl adipate, divinyl phthalate, divinyl terephthalate, divinyl benzene- 1,3-disulfonate, and divinyl butane-1,4-disulfonate; styrene and derivatives thereof; and unsaturated aldehydes, such as sorbaldehyde (2,4-hexadienal).

An outstanding class of these preferred addition polymerization components are the esters and amides of alpha-methylene carboxylic acids and substituted alpha-methylene carboxylic acids with polyols and polyamines wherein the molecular chain between the hydroxyl and amino groups is solely carbon or oxygen-interrupted carbon. The preferred unsaturated compounds are polyfunctional, but monofunctional compounds can also be used. In addition, the polymerizable, ethylenically unsaturated polymers of Burg, U.S. Pat. No. 3,043,805; Martin, U.S. Pat. No. 2,929,710; and similar materials may be used alone or mixed with other materials. Acrylic and methacrylic esters of polyhydroxy compounds such as pentaerythritol and trimethylolpropane, and acrylic and methacrylic esters of adducts of ethylene oxide and polyhydroxy compounds such as those described by Cohen and Schoenthaler in U.S. Pat. No. 3,380,831 are also useful. The photocrosslinkable polymers disclosed in Schoenthaler, U.S. Pat. No. 3,418,295, and Celeste, U.S. Pat. No. 3,448,089, may also be used. The amount of unsaturated compound added varies with the particular polymer used.

Suitable polymeric binders for use in the unsaturated compound/binder system have molecular weights of at least about 4,000 and are present in the amount of about 3 to about 95% by weight, and preferably about 25 to about 75% by weight of the total solvent-free coating. They include:

A. Copolyesters, e.g., those prepared from the reaction product of a polymethylene glycol of the formula $HO(CH_2)_n OH$, wherein $n$ is a whole number from 2 to 10, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids, and (ii) terephthalic, isophthalic, sebacic and adipic acids;

B. Nylons or polyamides, e.g., N-methoxymethyl polyhexamethylene adipamide;

C. Vinylidene chloride copolymers, e.g., vinylidene chloride/acrylonitrile, vinylidene chloride/methacrylate, and vinylidene chloride/vinyl acetate copolymers;

D. Ethylene/vinyl acetate copolymers;

E. Cellulosic ethers, e.g., methyl cellulose, ethyl cellulose, and benzyl cellulose;

F. Polyethylene;

G. Synthetic rubbers, e.g., butadiene/acrylonitrile copolymers, and chloro-2-butadiene-1,3-polymers;

H. Cellulose esters, e.g., cellulose acetate, cellulose acetate succinate, and cellulose acetate butyrate;

I. Polyvinyl esters, e.g., polyvinyl acetate/acrylate, polyvinyl acetate/methacrylate, and polyvinyl acetate;

J. Polyacrylate and alpha-alkyl polyacrylate esters, e.g. polymethyl methacrylate, polyethyl methacrylate, polymethyl methacrylate/acrylic acid, and polymethyl methacrylate/methacrylic acid;

K. High molecular weight polyethylene oxides of polyglycols having number average molecular weights from 4,000 to 1,000,000.

L. Polyvinyl chloride and copolymers, e.g., polyvinyl chloride/acetate;

M. Polyvinyl acetal, e.g., polyvinyl butyral and polyvinyl formal;

N. Polyformaldehyde;

O. Polyurethanes;

P. Polycarbonates; and

Q. Polystyrenes. A preferred group of binders includes the polyacrylates and α-alkylacrylate esters, particularly polymethyl methacrylate.

Although thermoplastic binders are normally and preferably employed, there can be added in addition to or instead of said binders nonthermoplastic polymeric compounds to improve certain desirable characteristics, e.g., adhesion to the base support, adhesion to the image-receptive support on transfer, wear properties, chemical inertness, etc. Suitable nonthermoplastic polymeric compounds include polyvinyl alcohol, cellulose, anhydrous gelatin, phenolic resins and melamine-formaldehyde resins, etc.

If desired, the photohardenable coating compositions can also contain immiscible, polymeric or nonpolymeric, organic or inorganic fillers or reinforcing agents which are essentially transparent at the wavelengths used for exposure of the photohardenable material, e.g., the organophilic silicas, bentonites, silica, powder glass, collodial carbon, as well as various types of dyes and pigments. Such materials are used in amounts varying with the desired properties of the photohardenable compositions. The fillers are useful in improving the strength of the photohardenable layer, reducing tack and, in addition, as coloring agents.

When the polymer is a hard, high-melting compound, a plasticizer may be used to lower the glass transition temperature and facilitate selective development. The plasticizer may be any of the common plasticizers compatible with the polymeric binder. Among the common plasticizers are dialkyl phthalates, alkyl phosphates, polyethylene glycol, polyethylene glycol esters, and polyethylene glycol ethers.

The photohardenable coating composition also contains an organic, radiation-sensitive free-radical generating system which initiates polymerization of the unsaturated compound and does not subsequently terminate the polymerization. The word "organic" is used here and in the claims to designate compounds which contain carbon, and one or more of oxygen, hydrogen, nitrogen, sulfur and halogen, but no metal. The concentration of the free-radical generating system employed should be about 1.0 to about 10% by weight based on the total solvent-free coating components, and preferably about 2 to about 8%.

The free-radical generating system absorbs radiation within the range of about 2000 to about 8000 A and has at least one component that has an active radiation absorption band with a molar extinction coefficient of at least about 50 within the range of about 2500 to about 8000 A, and preferably about 2500 to about 5000 A. The term "active radiation absorption band" means a band of radiation which is active to produce the free radicals necessary to initiate polymerization or cross-linking of the unsaturated material.

The free-radical generating system can comprise one or more compounds which directly furnish free radicals when activated by radiation. It can also comprise a plurality of compounds, one of which yields the free radicals after having been caused to do so by a sensitizer which is activated by radiation.

A large number of such free-radical generating compounds can be utilized in the practice of the invention and include aromatic ketones such as benzophenone, Michler's ketone [4,4'-bis(dimethylamino)benzophenone], 4,4'-bis(diethylamino)benzophenone, 4-acryloxy-4'-dimethylaminobenzophenone, 4-acryloxy-4'-diethylaminobenzophenone, 4-methoxy-4'-dimethylaminobenzophenone, 2-ethylanthraquinone, phenanthraquinone, 2-t-butylanthraquinone, 1,2-benzanthraquinone, 2,3-benzanthraquinone, 2,3-dichloronaphthoquinone, and other aromatic ketones; benzoin, benzoin ethers such as benzoin methyl ether, benzoin ethyl ether and benzoin phenyl ether, methylbenzoin, ethylbenzoin and other benzoins; and 2,4,5-triarylimidazolyl dimers such as 2-(o-chlorophenyl)-4,5-diphenylimidazolyl dimer, 2-(o-chlorophenyl-4,5-di(m-methoxyphenyl))imidazolyl dimer, 2(o-fluorophenyl)-4,5-diphenylimidazolyl dimer, 2-(o-methoxyphenyl)-4,5-diphenyl-imidazolyl dimer, 2-(p-methoxyphenyl)-4,5-diphenylimidazolyl dimer, 2,4-di(p-methoxyphenyl)-5-phenylimidazolyl dimer, 2-(2,4-dimethoxyphenyl)-4,5-diphenylimidazolyl dimer, 2-(p-methylmercaptophenyl)-4,5-diphenylimidazolyl dimer, and the like as disclosed in U.S. Pat. Nos. 3,479,185 and 3,784,557 and in British Pat. Nos. 997,396 and 1,047,569.

The imidazolyl dimers are used with a free-radical producing electron donor such as 2-mercaptobenzoxazole, leuco crystal violet or tris(4-diethylamino-2-methylphenyl)-methane, which is preferred. Such sensitizers as Michler's ketone may be added. Various energy transfer dyes such as Rose Bengal and Eosin Y can also be used. Additional examples of suitable initiators are disclosed by Plambeck in U.S. Pat. No. 2,760,863. The preferred initiating systems employ triarylimidazolyl dimers and a free-radical producing electron donor, with or without the use of sensitizing compounds as described in U.S. Pat. No. 3,479,185 to Chambers. The 2,4,5-triphenylimidazolyl dimers having an ortho substituent on the 2-phenyl ring are particularly useful as components of the initiating system because of their stability. Such dimers include 2-(o-chlorophenyl)-4,5-diphenylimidazolyl dimer, 2-(o-fluorophenyl)-4,5-diphenylimidazolyl dimer, and 2-(o-methoxyphenyl)-4,5-diphenylimidazolyl dimer.

The photohardenable compositions of this invention also contain a tetracyanoethane compound of the formula

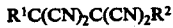

in which $R^1$ and $R^2$ are as stated above. The concentration of the tetracyanoethane compound in the composition should be about 0.04 to about 3% by weight, and preferably about 0.1 to about 1% by weight based on the total solvent-free coating components.

Suitable tetracyanoethane compounds include

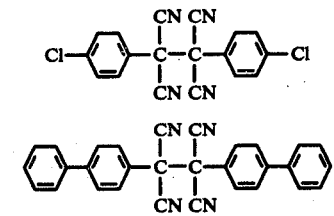

-continued

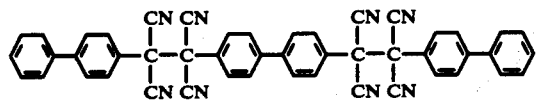

polymers of α, α, α′, α′-tetracyano-p-quinodimethane represented by the formula

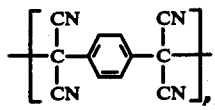

(see British Pat. No. 1,291,437, FIG. 2)

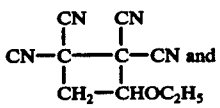

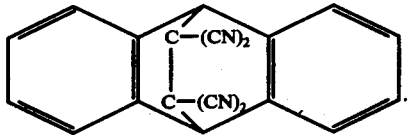

The preferred tetracyanoethane compounds are polymers of α, α, α′, α′-tetracyano-p-quinodimethane and p,p′-dichloro-1,1,2,2-tetracyanodiphenylethane because of their excellent solubility characteristics and the shelf stability of coating compositions containing them.

The photohardenable coating compositions described herein may be applied to a wide variety of substrates. By "substrate" is meant any natural or synthetic support, especially one which is capable of existing in a flexible or rigid film or sheet form. For example, the substrate could be a metal sheet or foil, a sheet or film of synthetic organic resin, cellulose paper, fiberboard, and the like, or a composite of two or more of these materials. Specific substrates include copper, alumina-blasted aluminum, oriented polyester film, alumina-blasted oriented polyester film, polyvinylidene chloride-coated oriented polyester film, polyvinyl alcohol-coated paper, cross-linked polyester-coated paper, nylon, glass, heavy paper such as lithographic paper, polypropylene film, silicon wafers, and the like. The preferred substrate is copper.

The photohardenable coating compositions are preferably applied to substrates and formed into films by processes which do not employ heat. Deposition from solution is preferred. Suitable solvents are shown in the accompanying examples and others will be apparent to those skilled in the art. The resulting photohardenable films and coatings are generally in the form of a photoresist coating on a substrate.

The photohardenable coatings can serve as photoresists in making etched or plated circuits or in chemical milling applications. For example, the photohardenable coating composition may be applied in liquid form to a substrate followed by drying. A removable cover sheet may be applied to the surface of the resultant layer in order to protect it during handling. Upon removing the cover sheet if present, the dry layer can be laminated to another substrate for its ultimate use, using conventional laminating equipment to apply pressure and generally using heat. The original substrate now becomes a cover sheet. This technique is particularly useful in applying the compositions for use as photoresists, such as described in U.S. Pat. No. 3,469,982, wherein the original substrate is a polymeric film and the substrate to which the layer is transferred generally has a metal or ceramic surface.

Photohardening is accomplished by exposure to radiation preferably having a wavelength range between about 2500 A and 5000 A. Suitable sources of such radiation include ordinary sunlight and artificial sources such as sunlamps; pulsed and continuous xenon flash lamps; germicidal lamps; ultraviolet lamps providing specifically radiation of short wavelength (2537 A); and lamps providing radiation of longer wavelengths, narrow or broad band, centered near 3600 A, 4000 A, 4500 A, or 5000 A, such as fluoroescent lamps, mercury, metal additive, and arc lamps. Argon glow lamps, photographic flood lamps, and other fluoroescent light sources such as the tracings on the face of a cathode ray tube may also be used. Electron accelerators and electron beam sources through an appropriate mask are also suitable. The radiation exposure time to obtain maximum resolution may vary from fractions of a second to minutes, depending upon the intensity and spectral energy distribution of the radiation, its distance from the composition and the nature and amount of the composition available. Customarily, a mercury vapor arc or a sunlamp is used at a distance of about 1.5 to about 20 inches (3.8–50.8 cm) from the photosensitive composition. Exposure temperatures are not particularly critical, but it is preferred to operate at about ambient temperatures or slightly higher, i.e., about 20° to about 35° C.

Imagewise exposure, for example in preparing printing plates, is conveniently carried out by exposing a layer of the photohardenable composition to radiation through a process transparency, for example a process negative or positive; that is, an image-bearing transparency consisting solely of areas substantially opaque and substantially transparent to the radiation being used, where the opaque areas are substantially of the same optical density; for example, a so-called line or halftone negative or positive. Process transparencies may be constructed of any suitable materials including cellulose acetate film and oriented polyester film.

After exposure the image may be developed by toning, i.e., dusting with a fine pigment which selectively adheres to the tacky unhardened areas. In other applications, portions of the film corresponding to the unexposed portions are removed, e.g., in photoresist applications. A preferred method of removing the unhardened material is to employ a suitable solvent applied by an air spray. The use of an air spray, rather than the conventional method of spraying liquid solvents, enables advantages to be taken of the high resolution and the accompanying increase in aspect ratio achievable with the compositions of the present invention.

Other uses for the compositions of the present invention will be evident to those skilled in the art. Specific uses are disclosed in U.S. Pat. Nos. 2,760,863; 3,060,023; 3,469,982 and 3,060,026.

EXAMPLES OF THE INVENTION

The following are illustrative examples of the invention in which all parts and percentages are by weight and all degrees are Celsius unless otherwise stated.

PREPARATION AND TESTING OF COATINGS

Coating solutions were prepared by dissolving the reactants in methylene chloride at 25°. The solutions were coated with a doctor knife onto "one oz" (28 g) copper-clad circuit board. The copper surfaces of the boards were cleaned with pumice powder and water just before coating with the photopolymer solutions. The coatings were dried at 25°, and those coatings so identified were coated with a 1% polyvinyl alcohol solution ("Elvanol" 51-05, E. I. du Pont de Nemours & Co.) in water using a cotton ball dampened with the polymer solution. Coating thicknesses (dried) of these top coats were Θ 0.05 mil (0.000127 cm).

Samples were exposed in a glass vacuum frame (nuArc Co.) at 1 mm pressure to a 275 watt sunlamp held 17 in (43.2 cm) away from the sample, except as noted. The system was evacuated for 2 minutes prior to exposure and during the exposure. Itek Corp. silver image film transparencies of a 1951 Air Force Test pattern (resolution of the bar patterns to 228 line pairs/mm) were used with the emulsion side of the patterns in contact with the photohardenable coatings. Immediately after exposure, the samples were washed with cold water to remove the polyvinyl alcohol coatings and then spray developed (unless otherwise noted) using methylchloroform in a spray gun held two inches (5.1 cm) from the samples. The developed samples were examined optically to determine the highest resolution elements which were washed out completely to the copper base of the sample.

STOCK SOLUTION AND CONTROL SAMPLE A

The test samples of the examples below were prepared by adding the additional materials to a measured portion of a stock solution. The amounts used were those which gave a 1.3 ml (0.0033 cm) coating after drying. A standard stock solution was made up of the following ingredients.

5.80 g of trimethylolpropane triacrylate containing 245 ppm of hydroquinone inhibitor
1.76 g of conventional plasticizers
0.88 g of triethyleneglycol diacetate
10.48 g of polymethyl methacrylate resins
0.80 g 2-o-chlorophenyl-4,5-diphenylimidazolyl dimer
0.02 g of Michler's ketone
0.06 g of tris(4-diethylamino-2-methylphenyl)-methane
0.04 g of adhesion promoter
80 ml of methylene chloride One-sixteenth portions of this solution were used for each test. For every stock solution, a control sample was also run, coded A.

EXAMPLE 1

Coating B was prepared by adding 0.020 g of 1,1,2,2-tetracyano-1,2-bis(p-biphenyl)ethane to the stock solution aliquot. Similarly, coatings C, D and E were prepared by using 0.010 g, 0.005 g, and 0.002 g, respectively, of the same material. The results are summarized in Table I and show that addition of the tetracyanoethane compound gives a marked increase in resolution.

Table I

| Sample | Exposure Time (min) | Resolution (line pairs/mm) |
| --- | --- | --- |
| A (control) | 0.17 | 9 |
| A | 0.33 | 12.7 |
| A | 0.50 | 25.4 |
| A | 0.67 | 18 |
| A | 0.83 | 20 |
| A | 1.0 | 18 |
| B | 3.5 | 32 |
| B | 4.0 | 40 |
| B | 4.25 | 45 |
| B | 4.5 | 45 |
| B | 4.75 | 36 |
| B | 5.0 | 36 |
| C | 1.0 | 18 |
| C | 1.17 | 16 |
| C | 1.33 | 16 |
| C | 1.5 | 25.4 |
| C | 1.67 | 14.3 |
| C | 1.83 | 51 |
| C | 2.0 | 22.5 |
| D | 0.50 | 12.7 |
| D | 1.0 | 40 |
| D | 1.33 | 40 |
| D | 1.5 | 51 |
| D | 1.67 | 22.5 |
| D | 1.83 | 20 |
| D | 2.0 | 20 |
| E | 0.50 | 9 |
| E | 0.67 | 22.5 |
| E | 0.83 | 22.5 |
| E | 1.0 | 40 |
| E | 1.17 | 25.4 |
| E | 1.33 | 40 |
| E | 1.5 | 16 |
| E | 1.67 | 16 |

The 1,1,2,2-tetracyano-1,2-bis(p-biphenyl)ethane was prepared by oxidation of p-biphenylmalononitrile with N-iodosuccinimide in acetonitrile solution at 25°. The product was obtained as tan crystals, mp >240°.

EXAMPLE 2

Coatings B and C were prepared by adding 0.008 g and 0.002 g, respectively, of 4,4'-bis(1,1,2,2-tetracyano-2-p-biphenylethyl)biphenyl to the stock solution aliquot. The results are summarized in Table II and show the improvement in resolution obtained by addition of the tetracyanoethane compound.

Table II

| Sample | Exposure Time (min) | Resolution (line pairs/mm) |
| --- | --- | --- |
| A (control) | 0.17 | 9 |
| A | 0.33 | 16 |
| A | 0.50 | 28.5 |
| A | 0.67 | 22.5 |
| A | 1.0 | 11.3 |
| B | 1.5 | 16 |
| B | 1.67 | 40 |
| B | 1.75 | 32 |
| B | 1.83 | 32 |
| B | 2.0 | 51 |
| B | 2.17 | 14.3 |
| C | 1.33 | 18 |
| C | 1.4 | 28.5 |
| C | 1.5 | 45 |
| C | 1.58 | 16 |
| C | 1.83 | 8 |

The 4,4'-bis(1,1,2,2-tetracyano-2-p-biphenyl-ethyl)-biphenyl was prepared by oxidation of a mixture of p-bi-phenylmalononitrile and 4,4'-bis(dicyanomethyl)-biphenyl with N-iodosuccinimide in acetonitrile at 25°. After 30 minutes the reaction mixture was filtered, the precipitate was dissolved in THF, the solution filtered, and the filtrate was concentrated to dryness. The solid was suspended in acetonitrile and the solid product separated by filtration and dried.

Anal. Calcd. for $C_{48}H_{26}N_8$: C, 80.80; H, 3.67; N, 15.70. Found: C, 80.29; H, 4.08; N, 14.07. C, 80.43; H, 4.01.

EXAMPLE 3

Coating B was made by adding 0.002 g of a polymer of α, α, α', α'-tetracyano-p-quinodimethane (prepared as described in British Pat. No. 1,291,437) dissolved in 1 ml of THF to a stock solution aliquot. The results are described in Table III and show the improvement in resolution obtained by addition of the tetracyanoethane compound.

Table III

| Sample | Exposure Time (min) | Resolution (line pairs/mm) |
| --- | --- | --- |
| A (control) | 0.33 | 14.3 |
| A | 0.50 | 40 |
| A | 0.67 | 51 |
| A | 0.83 | 25.4 |
| B | 1.0 | 72 |
| B | 1.5 | 57 |
| B | 2.0 | 40 |
| B | 2.5 | 25.4 |

The example was repeated using two different samples of the tetracyanoquinodimethane polymer, and in each case a similar improvement in resolution compared with the control samples was obtained.

EXAMPLE 4

Coating B was prepared by adding 0.003 g of 2,2,3,3-tetracyanocyclobutyl ethyl ether in 1 ml of THF to a stock solution aliquot. Coating C was prepared similarly except that 0.0018 g of trifluoroacetic acid was also added. Control A' also contained 0.0018 g of trifluoroacetic acid. The results are summarized in Table IV and show the resolution improvement obtained upon addition of the tetracyanoethane compound.

Table IV

| Sample | Exposure Time (min) | Resolution (line pairs/mm) |
| --- | --- | --- |
| A (control) | 0.17 | 7.1 |
| A | 0.33 | 18 |
| A | 0.50 | 20 |
| A | 0.67 | 16 |
| B | 1.0 | 32 |
| B | 1.17 | 57 |
| B | 1.33 | 36 |
| B | 1.50 | 28.5 |
| B | 1.67 | 32 |
| B | 1.83 | 32 |
| B | 2.0 | 40 |
| A' (control) | 0.33 | 18 |
| A' | 0.50 | 18 |
| A' | 0.67 | 18 |
| A' | 0.83 | 16 |
| A' | 1.0 | 11.3 |
| A' | 1.17 | 11.3 |
| C | 1.0 | 64 |
| C | 1.17 | 40 |
| C | 1.67 | 45 |
| C | 1.83 | 51 |
| C | 2.0 | 40 |
| C | 2.17 | 40 |
| C | 2.33 | 40 |
| C | 2.50 | 36 |
| C | 2.67 | 28.5 |
| C | 3.0 | 22.5 |
| C | 3.0 | 22.5 |
| C | 4.0 | 22.5 |
| C | 5.0 | 18 |

EXAMPLE 5

Coating B was prepared by adding 0.010 g of

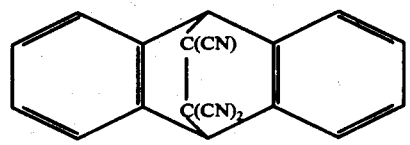

and 0.0018 g of trifluoroacetic acid to a stock solution aliquot. Control coating A' also contained 0.0018 g of trifluoroacetic acid. The results are summarized in Table V and show the resolution improvement obtained upon addition of the tetracyanoethane compound.

Table V

| Sample | Exposure Time (min) | Resolution (line pairs/mm) |
| --- | --- | --- |
| A' (control) | 0.17 | 12.7 |
| A' | 0.33 | 18 |
| A' | 0.50 | 22.5 |
| A' | 0.67 | 18 |
| A' | 0.83 | 16 |
| B | 1.0 | 40 |
| B | 1.17 | 45 |
| B | 1.33 | 45 |
| B | 1.50 | 51 |
| B | 1.67 | 40 |
| B | 1.83 | 36 |
| B | 2.0 | 36 |
| B | 3.0 | 32 |
| B | 4.0 | 18 |
| B | 5.0 | 16 |

EXAMPLE 6

Coating B was prepared by adding 0.010 g of p,p'-dichloro-1,1,2,2-tetracyanodiphenylethane to a stock solution aliquot which also contained 0.0018 g of trifluoroacetic acid. The control coating A' also contained 0.0018 g of trifluoroacetic acid. The results are summarized in Table IV and show the resolution improvement obtained upon addition of the tetracyanoethane compound.

Table VI

| Sample | Exposure Time (min) | Resolution (line pairs/mm) |
| --- | --- | --- |
| A' (control) | 0.17 | 12.7 |
| A' | 0.33 | 18 |
| A' | 0.50 | 22.5 |
| A' | 0.67 | 18 |
| A' | 0.83 | 16 |
| B | 1.0 | 20 |
| B | 2.0 | 45 |
| B | 3.0 | 57 |
| B | 4.0 | 28.5 |
| B | 5.0 | 45 |
| C | 1.0 | 25.4 |
| C | 1.5 | 32 |
| C | 2.0 | 22.5 |
| C | 2.5 | 16 |
| C | 3.0 | 25.4 |

The p,p'-dichloro-1,1,2,2-tetracyanodiphenylethane was prepared by treatment of an equimolar mixture of p-chlorophenylmalononitrile and sodium hydroxide in water with a 0.5 molar equivalent of bromine in water at 25° for 10 minutes with stirring. Excess sodium hydroxide and excess bromine were added sequentially, and the solid product was separated by filtration, washed with water and air dried. Recrystallization from acetonitrile gave white crystalline p,p'-dichloro-1,1,2,2-tetracyanodiphenylethane, mp 237°-239°. The infrared spectrum was consistent with the structure.

I claim:

1. A photohardenable coating composition which comprises
   a. a substantially solid, organic composition comprising an addition polymerizable, nongaseous, ethylenically unsaturated compound capable of forming a high polymer by free-radical initiated chainpropagating addition polymerization, and a macromolecular, organic, polymeric binder.
   b. 1.0-10% by weight, based on the total solvent-free coating, of an organic, radiation-sensitive free-radical generating system activatable by actinic radiation which initiates polymerization of the unsaturated compound, and
   c. 0.04-3% by weight, based on the total solvent-free coating, of a tetracyanoethane compound of the formula

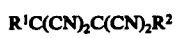

where $R^1$ and $R^2$ are both p-chlorophenyl or p-biphenyl, or
   $R^1$ is p-biphenyl and $R^2$ is

, or

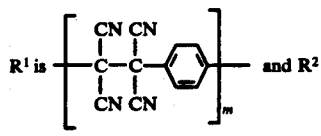

where $m$ and $n$ represent the number of repeat units, or
   $R^1$ and $R^2$ are joined together to form the —C-H(OC$_2$H$_5$)CH$_2$— radical, or
   $R^1$ and $R^2$ are joined together to form the

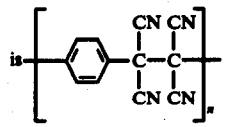 radical.

2. The photohardenable coating composition of claim 1 in which the polymeric binder is present in the amount of 3-95% by weight, based on the total solvent-free coating components, and has a molecular weight of at least 4000.

3. The photohardenable coating composition of claim 2 in which the free-radical generating system absorbs radiation within the range of 2000-8000A and at least one component that has an active radiation absorption band with a molar extinction coefficient of at least 50 within the range of 2500-8000A.

4. The photohardenable coating composition of claim 3 in which the free-radical generating system has at least one component that has an active radiation absorption band with a molar extinction coefficient of at least 50 within the range of 2500-5000A.

5. The photohardenable coating composition of claim 4 in which the polymeric binder is present in the amount of 25-75% by weight of the total solvent-free coating components.

6. The photohardenable coating composition of claim 5 in which the tetracyanoethane compound is present in the amount of 0.1-1% by weight based on the total solvent-free coating components.

7. The photohardenable coating composition of claim 6 wherein said initiator system is based on a 2,4,5-triarylimidazolyl dimer and a free-radical producing electron donor system.

8. The photohardenable coating composition of claim 7 wherein the 2,4,5-triarylimidazolyl dimer is 2-(o-chlorophenyl)-4,5-diphenylimidazolyl dimer.

9. The photohardenable coating composition of claim 8 wherin the free-radical producing electron donor system is tris(4-diethylamino-2-methylphenyl)methane.

10. The photohardenable coating composition of claim 9 wherein Michler's ketone is also present as a sensitizer.

11. The photohardenable coating composition of claim 1 in which the tetracyanoethane compound is a polymer of $\alpha, \alpha, \alpha', \alpha'$-tetracyano-p-quinodimethane.

12. The photohardenable coating composition of claim 1 in which the tetracyanoethane compound is p,p'-dichloro-1,1,2,2-tetracyanodiphenylethane.

13. The photohardenable coating composition of claim 1 in which the tetracyanoethane is 1,1,2,2-tetracyano-1,2-bis(p-biphenyl)ethane.

14. The photohardenable coating composition of claim 1 in which the tetracyanoethane compound is 4,4'-bis(1,1,2,2-tetracyano-2-biphenylethyl)biphenyl.

15. The photohardenable coating composition of claim 1 in which the tetracyanoethane compound is 2,2,3,3-tetracyanocyclobutyl ethyl ether.

16. The photohardenable coating composition of claim 1 in which the tetracyanoethane compound is

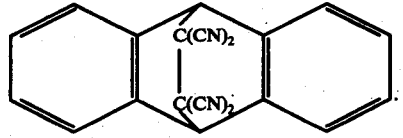

17. A photohardenable film which comprises the photohardenable composition of claim 1.

* * * * *

UNITED STATES PATENT OFFICE
CERTIFICATE OF CORRECTION

PATENT NO. : 4,050,941

DATED : September 27, 1977

INVENTOR(S) : José Francisco Pazos

It is certified that error appears in the above-identified patent and that said Letters Patent are hereby corrected as shown below:

Column 2, line 26, "p-bipenyl" should read -- p-biphenyl --.

Column 4, line 1, "bis( -methacrylamidopropoxy)e-" should read -- bis(γ-methacrylamidopropoxy)e- --.

Column 8, line 57, "vantages" should read -- vantage --.

Column 9, line 14, "θ" should read -- $\leq$ --.

Column 9, line 37, "ml" should read -- mil --.

Column 13, line 9, (Claim 1, subparagraph a., line 4), "chainpropa-" should read -- chain-propa- --.

Column 13, line 11, (Claim 1, subparagraph a., line 6), the period at the end of the line should be a comma.

Column 14, line 3, (Claim 3, line 3), "and at" should read -- and has at --.

Signed and Sealed this

Fourteenth Day of March 1978

[SEAL]

Attest:

RUTH C. MASON
Attesting Officer

LUTRELLE F. PARKER
Acting Commissioner of Patents and Trademarks